United States Patent [19]

Carter, Jr.

[11] Patent Number: 5,210,051
[45] Date of Patent: May 11, 1993

[54] HIGH EFFICIENCY LIGHT EMITTING DIODES FROM BIPOLAR GALLIUM NITRIDE

[75] Inventor: Calvin H. Carter, Jr., Raleigh, N.C.

[73] Assignee: Cree Research, Inc., Durham, N.C.

[21] Appl. No.: 710,827

[22] Filed: Jun. 5, 1991

Related U.S. Application Data

[62] Division of Ser. No. 499,960, Mar. 27, 1990, abandoned.

[51] Int. Cl.$^5$ .......................................... H01L 21/205
[52] U.S. Cl. ..................... 437/107; 437/126; 437/174; 148/DIG. 46; 148/DIG. 113; 148/DIG. 148
[58] Field of Search ............... 437/107, 126, 127, 905, 437/173, 174; 148/DIG. 65, DIG. 46, DIG. 113, DIG. 148, DIG. 169

[56] References Cited

U.S. PATENT DOCUMENTS 4,396,929  8/1983  Ohki et al. ........................... 357/17
4,608,581  8/1986  Bagratishvici et al. ............... 357/17

OTHER PUBLICATIONS

Sasaki, T., "substrate-polarity . . . on SiC", J. Appl. Phys., Nov. 1988 pp. 4531–4535.
Davis, R., "Critical Evaluation . . . Carbide", *Mat. Science & Engineering*, 1988, pp. 77–104.
Yoshida, S., "Epitaxial Growth . . . Heterostructures", J. Vac. Sci & Tech., Apr. 6, 1983; pp. 250–253.
Amano, H., "Metalorganic Vapor . . . Layer", Appl. Phys. Lett., Feb. 1986, pp. 353–355.
Sitar, Z., "Growth of AW/GAN . . . Epitaxy" J. Vac. Sci. Tech. B 8(2) Mar./Apr. 1990 pp. 316–322.
Amano, H., "UV and Blue . . . Irradiation", Preceedings of SPIE-The International Society for Optical Engineering, vol. 1361, Part 1, pp. 138–149 (1991).
Zensutsu, S. "Growth of GaN . . . Epitaxy" Appl. Phys. Lett. 48(13), Mar. 1986, pp. 870–872.
Paisley, M., "Growth of Cubic . . . Epitaxy", J. Vac. Sci Tech., May 6, 1989, pp. 701–705.
Chu T., "Galluim Nitride Films", J. Electrochemical Society, Jul. 1971, pp. 1200–1203.

*Primary Examiner*—George Fourson
*Attorney, Agent, or Firm*—Bell, Seltzer, Park & Gibson

[57] ABSTRACT

The invention is a method of growing intrinsic, substantially undoped single crystal gallium nitride with a donor concentration of $7 \times 10^{17}$ cm$^{-3}$ or less. The method comprises introducing a source of nitrogen into a reaction chamber containing a growth surface while introducing a source of gallium into the same reaction chamber and while directing nitrogen atoms and gallium atoms to a growth surface upon which gallium nitride will grow. The method further comprises concurrently maintaining the growth surface at a temperature high enough to provide sufficient surface mobility to the gallium and nitrogen atoms that strike the growth surface to reach and move into proper lattice sites, thereby establishing good crystallinity, to establish an effective sticking coefficient, and to thereby grow an epitaxial layer of gallium nitride on the growth surface, but low enough for the partial pressure of nitrogen species in the reaction chamber to approach the equilibrium vapor pressure of those nitrogen species over gallium nitride under the other ambient conditions of the chamber to thereby minimize the loss of nitrogen from the gallium nitride and the nitrogen vacancies in the resulting epitaxial layer.

15 Claims, 3 Drawing Sheets

HIGH EFFICIENCY LIGHT EMITTING DIODES FROM BIPOLAR GALLIUM NITRIDE

This application is a divisional of application Ser. No. 07/499,960, filed Mar. 27, 1990, now abandoned.

FIELD OF THE INVENTION

The present invention relates to light emitting diodes formed in semiconductor materials, and in particular, relates to light emitting diodes formed from bipolar junctions in gallium nitride.

BACKGROUND OF THE INVENTION

Light emitting diodes (LED's) are semiconductor devices that emit light in response to the application of electric current. As is known to those familiar with the properties of electromagnetic radiation and the properties of materials, electromagnetic radiation is emitted from a material, or correspondingly absorbed by a material, when the material undergoes some sort of internal transition. When the transitions are vibrational in nature, the associated frequencies and wavelengths of electromagnetic radiation are generally in the infrared region. When the transitions are rotational, the associated wavelengths and frequencies are in the microwave region. Each of these terms is, of course, used somewhat broadly in this brief description. Visible light, however, i.e. electromagnetic radiation visible to the human eye, is generally associated with electronic transitions between electron energy levels in atoms or molecules. Additionally, light which is not visible to the human eye, but which falls generally into the ultraviolet (UV) region is likewise related to such electronic transitions.

As further known to those familiar with the interaction of light and materials, electronic transitions refer to the movement of electrons between various allowed positions in atoms or molecules. These positions can be referred to by a number of designations, but for purposes of this discussion, and as generally used in the art, these will be referred to as bands. Typically, when an electron moves from a higher energy band to a lower energy band, the energy associated with that transition will be given off as a photon; i.e. light. Correspondingly, when an appropriate wavelength of light is applied to a material, the transition from a lower energy band to a higher energy band may take place. Although much more could be said about such transitions, a fundamental point of the nature of visible light is that the wavelength of the photon emitted is directly related to the energy difference between the appropriate bands.

In turn, the energy difference between bands is a function of the particular material. Some materials have larger differences, others lesser ones. Accordingly, the wavelength or wavelengths of light emitted by any particular material are a fundamental characteristic of that material and although somewhat alterable are generally limited.

The nature of light is such that ultraviolet light or light in the blue portion of the visible spectrum represents higher energy photons and larger energy differences between bands than does light in the red portion of the spectrum which represents lower frequencies, longer wavelengths, and lesser energy differences between bands. Fundamentally, this requires that a material which will emit light in the blue portion of the visible spectrum must have an energy difference or "gap" between bands that is larger than that required by the production of other colors of light. Accordingly, only certain materials can appropriately be used to form light emitting diodes which can emit blue light.

As recognized by those familiar with these facts and phenomena, the blue and ultraviolet portions of the electromagnetic spectrum are adjacent one another and the general designations for such wavelengths are often used in overlapping fashion. Thus, as used in this art and as used herein, terms such as "blue," "violet," "near ultraviolet," and "ultraviolet," are used descriptively, rather than in any limiting fashion.

Gallium nitride (GaN) is one such promising candidate for use in "short wavelength" devices (i.e. blue LED's and UV LED's), because it has a direct band gap of 3.39 electron volts (eV). In a direct band gap material, the minimum of the conduction band and the maximum of the valance band coincide at the same momentum, which in simpler terms means that all of the energy from the transition that takes place when an electron moves between the bands is emitted as light. In indirect band gap materials, some of the energy of the transition is given off in forms other than light, usually as vibrational energy. Thus, direct band gap materials such as gallium nitride have an inherent efficiency advantage over indirect band gap materials.

In order to produce appropriate LED's from candidate materials such as GaN, however, more than the material itself is required. First, extremely pure material is required because impurities, even in relatively small amounts, usually modify, interfere with or even prevent electronic transitions as well as other electronic characteristics of a material. Secondly, an LED generally requires a single crystal of an appropriate material because multiple crystals or defects in single crystals likewise undesirably modify or negate the electronic characteristics of a material.

Additionally, in order to produce a working device, structure must be included which provides the opportunity for current or voltage to be applied to the device and to initiate the electronic transitions that generate the emitted light. In many materials, this structure is commonly a junction structure, i.e. adjacent layers of p-type and n-type material. As known to those familiar with such devices and their operation, p-type material is a semiconductor material which has an excess of "acceptors" meaning that there are vacant positions available in the material into which electrons can move. These vacancies are commonly referred to as "holes". Correspondingly, in n-type material, there are additional electrons which can move within the material or to the adjacent p-type material. Thus, the flow of current in such a device can be thought of as either the flow of electrons or the flow of holes, but regardless of how described, such movement must take place. In a typical LED, current is sent ("injected") across such a p-n junction and thereby initiates the recombinations of electrons and holes and he light generating transitions desired.

Gallium nitride, however, presents some unique problems in producing p-n junctions, the most serious of which is the difficulty to date of producing p-type gallium nitride.

Additionally, gallium nitride is extremely difficult, if not impossible, to grow in the form of bulk crystals. This results because the dissociation temperature of gallium nitride falls within the temperature ranges necessary to accomplish bulk growth by typical methods such as pulling from a melt. Therefore, for electronic purposes, gallium nitride must be produced as epitaxial layers (thin films of single crystal material) on a different substrate material. As known to those familiar with crystallography and crystal growth, different materials have different crystal structures and the task of depositing on material on another, even where both are pure and in single crystal form, inherently creates mismatches between the materials which are referred to as lattice mismatches or thermal expansion mismatches. These in turn lead to stacking faults, partial dislocations and other terms familiar to those in this art. Such mismatches and faults will typically have an undesirable effect on the electronic properties of the epitaxial layer and any devices made from it.

Gallium nitride presents yet another difficulty, namely that of maintaining the stoichiometry (the chemical balance) of a gallium nitride crystal. Gallium nitride tends to be intrinsically non stoichiometric apparently because of the high propensity for nitrogen atoms to leave gallium nitride crystals. When the nitrogen atoms leave the crystal, they leave behind "nitrogen vacancies" which because of the Group III-Group V nature of GaN act as electron donors and produce an n-type crystal. Thus, as reported by one set of researchers, undoped gallium nitride epitaxial layers grown by chemical vapor deposition with carrier concentrations less than $1.4 \times 10^{17}$ cm$^{-3}$ have never been reported, R. F. Davis et al., *Materials Science and Engineering*, B1(1988) 77-104.

Therefore, because gallium nitride crystals are almost always n-type, high quality p-type material generally has been unavailable. One attempt to address the problem has been to add sufficient p-type dopant to gallium nitride to first match the concentration of n-type dopants or vacancies and then to add additional p-type dopant in an attempt to obtain some p-type characteristics. This, however, results in a material that is referred to in the semiconductor arts as a "compensated" p-type material because of the presence of significant amounts of both p and n-type dopants therein. Compensated materials are intentionally useful for some purposes, but for gallium nitride LED's, the compensated characteristic is generally undesirable. The reason for the undesirability is that the high concentration of both p and n carriers results in a very resistive, i.e. insulating (or "i-type"), crystal rather than a p-type crystal. Additionally, the electron mobility in this material correspondingly decreases beyond reasonable usefulness.

Therefore, a typical current method of producing a blue or UV LED using gallium nitride is to grow an epitaxial layer of n-type gallium nitride on a sapphire (crystalline Al$_2$O$_3$) substrate, add an insulating layer of gallium nitride to the n-type layer, then add a large metal contact to the insulating layer—the large contact being necessary because of the high resistivity of the insulating layer—and then add a smaller contact to the n-type epitaxial layer. Under high enough voltage, electrons will tunnel (a very inefficient process) into the n-type layer to produce the desired emission. Such a structure is often referred to as a metal-insulator-semiconductor (MIS) LED.

Accordingly, interest has been focused upon alternative methods of producing epitaxial layers of gallium nitride on appropriate substrates, and upon obtaining adjacent p and n type epitaxial layers which will give an appropriate junction and then LED characteristics.

One basic method attempted to date is the generally well understood technique of chemical vapor deposition (CVD) of gallium nitride on sapphire. Sapphire is chosen as the substrate of interest primarily because it is readily available as a single crystal, thermally stable, and transparent to the visible spectrum, as well as for its other appropriate characteristics familiar to those in this art. In a typical CVD process, source gases containing gallium and nitrogen are introduced into a chamber at a temperature intended to be high enough for the gases to disassociate into the appropriate atoms, and then for the appropriate atoms to stick to the substrate and grow in epitaxial fashion upon it.

Some early work in the attempts to produce gallium nitride concentrated on the deposition of gallium nitride films by the pyrolysis of a gallium tribromide ammonia complex, T. L. Chu, *J. Electro Chem. Soc.* 118, (7) (1981) 1200. The authors recognized that (because of the stoichiometry problems and associated nitrogen vacancies referred to earlier) undoped gallium nitride crystals had very high inherent electron concentrations, in this case between 1 and $5 \times 10^{19}$ cm$^{-3}$. The authors produced some gallium nitride films on silicon (Si) and some on hexagonal (alpha) silicon carbide (SiC). These films were nonetheless of high resistivity, a disadvantage explained earlier.

One related problem in chemical vapor deposition type growth of gallium nitride is that gaseous compounds are required as starting materials and high temperatures are often required to get the gases to dissociate into elemental gallium and nitrogen. These high temperatures, however, encourage an undesirable amount of nitrogen to exit the resulting nitride crystal as explained earlier. The equilibrium vapor pressure of molecular nitrogen (N$_2$) over gallium is rather high, particularly at high temperatures, so that the temperatures used for CVD exacerbate the stoichiometry problems already characteristic of GaN. The result is that even though growth can be accomplished, the nitrogen vacancy problem and the associated tendency to produce intrinsic n-type gallium nitride both remain.

CVD has further disadvantages. Because compounds are often required as the starting materials, there will be a corresponding set of by-products to be removed following dissociation of those compounds into the desired elements. For example, if (CH$_3$)$_3$Ga is used as the starting material to obtain atomic gallium, the remaining carbon, hydrogen, and hydrocarbon compounds and radicals eventually must be removed, otherwise they can act as contaminants from both purity and crystallographic standpoints. As a related disadvantage, the starting compounds almost always carry some sort of contamination, so that even if the stoichiometric by-products are removed, other contaminants may remain that will affect the growing crystal and any devices made from it.

Accordingly, a number of attempts have addressed the need to produce atomic nitrogen with a high enough energy to promote epitaxial growth of gallium nitride but at temperatures which are low enough to minimize the vapor pressure problems, the nitrogen vacancies, and the resulting n-type character of the layers that are grown. One technique for activating nitrogen is a pulse discharge technique as set forth in Eremin, et al., *Russian Journal of Physical Chemistry*, 56(5) (1982) 788-790. Other techniques include reactive ionized-cluster beam deposition (RICB), reactive and ionized molecular beam epitaxy (RBME and IMBE), and atomic layer epitaxy (ALE). Various references and discussions about these are set forth by R. F. Davis, et al., *Material Science and Engineering*, B1 (1988) 77–104. As set forth therein, the various CVD growth schemes for gallium nitride apparently fail to maintain stoichiometry resulting in the n-type gallium nitride described earlier.

A growth technique of more recent interest is molecular beam epitaxy (MBE). A molecular beam epitaxy system comprises a chamber in which an "ultra high" vacuum (e.g. $10^{-11}$ torr) is maintained. The elements to be deposited in crystalline form are kept adjacent the deposition chamber in heated containers known as Knudsen cells. When the shutters to the cells are opened, the elemental molecules exit and are limited to travel in substantially one direction towards a sample or substrate by the combination of cryogenic shrouds and the ultra high vacuum. The shrouds capture stray atoms and the high vacuum extends the mean free path of the molecules, greatly decreasing their tendency to collide and deviate from the path between the Knudsen cell and the sample. The sample is kept at a high enough temperature for epitaxial growth to take place.

Further details about molecular beam epitaxy or deposition systems is generally well-known to those familiar with the technique or can be developed without undue experimentation and will not otherwise be discussed in any further detail.

The main advantage of MBE over CVD for GaN processes is the lower temperatures at which growth will take place in an MBE system. Lower temperatures in turn reduce the vapor pressure of nitrogen and the number of nitrogen vacancies. Nevertheless, the MBE systems, although providing the lower temperatures desireable for these purposes, often fails to provide the nitrogen atoms with sufficient energy at the lower temperatures to form the desired stoichiometric crystals in epitaxial fashion. In other words, higher temperatures encourage epitaxial crystal growth, but at the expense of more nitrogen vacancies. Lower temperatures reduce the vapor pressure of nitrogen and thus favorably reduce nitrogen vacancies, but at the expense of poorer or slower epitaxial growth.

One technique for providing the nitrogen atoms with the favorable extra energy at the lower temperature is plasma excitation of nitrogen. Although theoretically helpful, such techniques have not resulted by themselves in successful growth of intrinsic epitaxial layers of gallium nitride with the low populations density required to form either neutral or p-type gallium nitride and resulting p-n junctions.

Another method is to activate the nitrogen by using microwave electron cyclotron resonance (ECR) plasma excitation. In such a system, microwaves are guided into the plasma chamber through a wave guide and the electrons in the plasma are magnetically controlled so that the electron cyclotron frequency coincides with the microwave frequency with the result that the plasma effectively absorbs the microwave energy. In effect, an ECR system simultaneously causes electrons to move in circular orbits and also confines the plasma. The result is a highly activated plasma obtained at relatively low gas pressures of between $10^{-5}$ and $10^{-3}$ torr. Such a plasma has both electron and ionic temperatures about one order of magnitude higher than those of the non-ECR plasma. To date, however, ECR techniques have not yet been demonstrated to produce either intrinsic undoped or successfully uncompensated p-type gallium nitride.

Finally, one other set of problems exists with many of the techniques used to grow epitaxial layers of gallium nitride, specifically, the use of sapphire as a substrate. As indicated by a number of the cited references, sapphire has been the substrate of choice in attempting to produce epitaxial layers of gallium nitride. First, mentioned earlier, when a substrate and an epitaxial layer are formed of different crystalline materials, some lattice mismatch between the two will inevitably exist as will some slight difference in other characteristics such as the coefficient of thermal expansion. Depending upon the specific values of the differences, the effect on the electronic properties will be small or large, but they will exist.

In this regard, and as discussed in somewhat more detail by Yoshida, et al. *J. Vac. Sci. Technol. B* 1, (2), (1983), 250–253, there exists a lattice mismatch of between 0.9 and 22.7% between gallium nitride and sapphire depending upon which plane of sapphire is used as the substrate face. Furthermore, the coefficient of liner expansion of sapphire is significantly greater than that of gallium nitride. Similarly, Davis et al. note that the lattice parameter values of sapphire are 23% greater than GaN and that sapphire's coefficient of thermal expansion is 25% greater than that of GaN.

Accordingly, researchers including Yoshida have produced epitaxial layers of gallium nitride using sapphire substrates by introducing an intermediate epitaxial layer of aluminum nitride (AlN). The lattice mismatch between gallium nitride and aluminum nitride is only 2.4 in selected planes which is much smaller than the lattice mismatch between gallium nitride and sapphire along corresponding planes. Additionally, along selected planes the difference in the coefficients of thermal expansion of gallium nitride and aluminum nitride is smaller than the difference between gallium nitride and sapphire. Based on these factors, a number of researchers have continued to incorporate aluminum nitride as a buffer layer between sapphire and gallium nitride. As discussed earlier, however, the addition of yet another material effects the electronic properties of the resulting structure and typically reduces the electronic capabilities of any resulting device.

There are other properties of sapphire other than the lattice mismatch and thermal expansion mismatch that are similarly disadvantageous. In particular, sapphire is nonconductive. As a result, the "back-contact" type of structure that is particularly useful for LED's is unavailable using sapphire substrate.

There thus exists the need for epitaxial layers of gallium nitride on conductive substrates, with good lattice matches, an appropriate coefficient of thermal expansion, and which are transparent to blue light. Furthermore, there exists the corresponding need for a method of growing epitaxial layers of gallium nitride on such substrates that can be conducted in a manner which reduces the tendency of nitrogen to leave the gallium nitride crystal and which can therefore be used to produce intrinsic gallium nitride that is substantially undoped and from which there can be produced substantially uncompensated p-type gallium nitride. Finally, there is a need to use these techniques to produce light emitting diodes in gallium nitride which emit blue light in a highly efficient fashion.

OBJECT AND SUMMARY OF THE INVENTION

Accordingly, it an object of the present invention to provide a method of growing intrinsic, substantially undoped single crystal gallium nitride with a low donor concentration, to correspondingly form p-type gallium nitride in the absence of the difficulties and results experienced to date, to form p-n junctions between respective portions of n-type and p-type gallium nitride, and to produce appropriate light emitting diodes from gallium nitride and that will produce efficient emission in the blue and ultraviolet regions of the spectrum.

The invention accomplishes this object by providing a method of growing intrinsic, substantially undoped single crystal gallium nitride with a donor concentration of $7 \times 10^{17}$ cm$^{-3}$ or less. The method comprises introducing a source of nitrogen into a reaction chamber containing a growth surface while introducing a source of gallium into the same reaction chamber and while directing nitrogen atoms and gallium atoms to a growth surface upon which gallium nitride will grow. The method further comprises concurrently maintaining the growth surface at a temperature high enough to provide sufficient surface mobility to the gallium and nitrogen atoms that strike the growth surface to reach and move into proper lattice sites, thereby establishing good crystallinity, to establish an effective sticking coefficient, and to thereby grow an epitaxial layer of gallium nitride on the growth surface, but low enough for the partial pressure of nitrogen species in the reaction chamber to approach the equilibrium vapor pressure of nitrogen over gallium nitride under the other ambient conditions of the chamber to thereby minimize the loss of nitrogen from the gallium nitride and the nitrogen vacancies in the resulting epitaxial layer.

The foregoing and other objects, advantages and features of the invention and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION OF THE PREFERRED EMBODIMENT

The invention comprises a method of growing intrinsic, substantially undoped single crystal gallium nitride (GaN) with a donor carrier concentration of $7 \times 10^{17}$ cm$^{-3}$ or less. It will be understood by those familiar with gallium nitride and its properties that the ability to grow substantially undoped single crystal gallium nitride provides the basis for the corresponding ability to form p-type gallium nitride, which in turn forms the basis for p-n junctions, and then junction devices such as light emitting diodes.

The method first comprises introducing a source of nitrogen into a reaction chamber containing a growth surface while introducing a source of gallium into the same reaction chamber containing the growth surface. In a preferred embodiment of the invention, the steps of introducing nitrogen and gallium are carried out by molecular beam epitaxy, a process briefly set forth in the background portion of the specification. The basic layout of such a system is fundamentally well understood and typical details are set forth in E. H. C. Parker (Ed.), *The Technology and Physics of Molecular Beam Epitaxy*, 1985, Plenum Press, New York, N.Y. A typical MBE system includes a deposition chamber into which the sample is placed. The chamber is maintained at an ultra high vacuum (UHV), on the order of $10^{-10}$ to $10^{-11}$ torr, which is typically produced by a UHV pump such an ion pump, a diffusion pump, a cryopump, or a turbomolecular pump. Adjacent the deposition chamber are a series of molecular beam or atomic source known as Knudsen cells. These in turn are partially surrounded by cryogenic shrouds that often contain liquid nitrogen so that when the shutter to a Knudsen cells is opened, the shrouds capture atoms or molecules exiting the Knudsen cell other than those moving in one general direction. Because the vacuum is so high in the deposition chamber, the remaining atoms or molecules have a fairly extensive mean free path and travel substantially undisturbed to the sample. At the sample, epitaxial growth of the desired compound takes place as the molecules or atoms impinge upon the growth surface. As set forth earlier, one of the main advantages of MBE is the ability to carry out epitaxial growth at relatively low temperatures, particularly compared to alternative methods such as chemical vapor deposition.

During the process, the growth surface is maintained at a temperature that is high enough to provide sufficient surface mobility to the gallium and nitrogen atoms that reach the growth surface to establish an effective sticking coefficient and to grow an epitaxial layer of gallium nitride while maintaining good crystallinity. The temperature is maintained low enough, however, for the partial pressure of nitrogen in the reaction chamber to approach or exceed the equilibrium vapor pressure of nitrogen over gallium nitride under the ambient conditions of the chamber. These conditions minimize the loss of nitrogen from the gallium nitride and the nitrogen vacancies in the resulting epitaxial layer.

As used herein, the term "sticking coefficient" refers to the ratio of atoms striking the growth surface to the number of atoms that actually remain to form a crystalline structure on that growth surface.

In evaluating the vapor pressure, it will be understood that depending upon the source of nitrogen, there may be a number of nitrogen species present. It has been found in accordance with the present invention that the vapor pressure of any of the nitrogen species present preferably should exceed the equilibrium vapor pressure of that species over gallium nitride under the ambient conditions of the chamber. For example, if the sole source of nitrogen species in the chamber is atomic nitrogen, then the partial pressure of atomic nitrogen should approach or must exceed the equilibrium vapor pressure of atomic nitrogen over gallium nitride. Alternatively, if ammonia is used as the nitrogen source, several species of nitrogen will very likely be present. In this case, the sum of the individual partial vapor pressures of each species must approach or exceed the equilibrium vapor pressure of those species over gallium nitride.

In practicing the present invention, it has accordingly been observed that ammonia is an appropriate nitrogen source for both CVD and MBE techniques, but that molecular nitrogen ($N_2$) is either less satisfactory (MBE) or unacceptable (CVD). Although the inventor does not wish to be bound by any particular theory, it is postulated that these results reflect the lower dissociation temperature of ammonia as compared with $N_2$ to produce atomic nitrogen. The observed success when using atomic nitrogen produced from an ECR plasma and then directed toward a substrate in an MBE system would, however, appear to bear out the theory that production of atomic nitrogen with a desired amount of energy is most helpful in producing epitaxial layers of GaN with the desired characteristics.

Although the invention includes the use of chemical vapor deposition as a method of introducing the nitrogen and the gallium and controlling the growth, the molecular beam epitaxy technique has been found to be preferable under most circumstances. As stated earlier, the main advantage of MBE is the lower temperature at which it can take place. Because the equilibrium vapor pressure of nitrogen over gallium nitride decreases as temperature decreases, the lower process temperature offered by MBE offers the corresponding opportunity to maintain a lower partial equilibrium vapor pressure of nitrogen over the gallium nitride. In turn, the partial pressure of the other nitrogen containing species present can likewise be lower in order to accomplish the desired growth.

For example, a preferred growth temperature using a MBE system is on the order of between about 600° and 650° C. with temperatures of 600° or lower being preferred. Such temperatures are generally lower than those required for CVD in which compounds are introduced as gases, and then heated to an appropriate dissociation temperature to obtain the desired atoms that sustain epitaxial growth.

As stated earlier, when the equilibrium vapor pressure of nitrogen over gallium nitride is high, the situation typically results in a large number of nitrogen vacancies in the gallium nitride crystal. Because these vacancies act as donors, an n-type doped crystal results. Although satisfactory where n-type gallium nitride is desired, this doped intrinsic materials is typically unsatisfactory for forming p-type gallium nitride and therefore unsatisfactory for producing p-n junctions and junction devices.

Because MBE takes place at such relatively low temperatures, however, some of the energy required to obtain a satisfactory sticking coefficient must be obtained through some fashion other than heating. In this regard, it has been found preferable to introduce nitrogen in the form of "active" nitrogen atoms that have been produced from a nitrogen containing plasma. The extra energy that the plasma provides to the nitrogen atoms increases the growth without increasing the temperature. In other words, the goal of a plasma assisted deposition system such as molecular beam epitaxy, or even chemical vapor deposition, is to provide a method of growing high melting point materials, such as nitride films, at low substrate temperatures.

In a preferred embodiment, the nitrogen atoms are introduced from an electron cyclotron resonance plasma in molecular beam epitaxy fashion and in the substantial absence of any other compounds. As stated in the background portion of the specification, such an ECR source uses a magnetic field to simultaneously cause electrons to move in circular orbits and to confine the plasma. Stated differently, a plasma chamber and magnetic coils control the electron cyclotron frequency so as to coincide with the microwave frequency and thus enable the plasma to effectively absorb the microwave energy, see e.g. S. Zembutsu, *Growth of GaN Single Crystal Films Using Electron Cyclotron Resonance Plasma Excited Metal Organic Vapor Phase Epitaxy*, Appl. Phys. Lett. 48 (13), 31 March 1986.

In the present invention the step of introducing nitrogen atoms from a nitrogen containing electron cyclotron resonance plasma comprises introducing nitrogen atoms that have been accelerated at less than 100 electron volts (eV). As stated earlier, as an alternative to introducing nitrogen from a nitrogen containing plasma, nitrogen can be introduced as active ammonia molecules from an ammonia containing electron cyclotron resonance plasma.

Additionally, although the nature of gallium nitride is such that the manner in which the nitrogen is introduced is one of the primary factors in successfully growing epitaxial layers, it is also preferred that the gallium be introduced as gallium atoms from another Knudsen cell in the same molecular beam epitaxy deposition system. Gallium can, however, be introduced as an organometallic compound such as trimethyl gallium (($CH_3$)$_3$Ga) or gallium chloride (GaCl), particularly in CVD techniques.

As stated in the background portion of the specification, either silicon carbide or sapphire can be selected as an appropriate substrate for such epitaxial layers of gallium nitride. In a preferred embodiment of the invention, however, the substrate of choice is silicon carbide. Silicon carbide has a much closer match of coefficient of thermal expansion and lattice parameters with gallium nitride than does the more commonly used sapphire. More importantly for commercialization and manufacturing purposes, silicon carbide can be made to be conductive to current and is substantially transparent to blue and ultraviolet light. Because silicon carbide can be made to be conductive, it permits the use of conventional back contacts in packaged diodes. Because it transmits blue light, it increases the overall efficiency of any resulting device and permits a variety of package orientations.

In a corresponding manner, the ability to grow an appropriate intrinsic epitaxial layer of gallium nitride with an acceptably low level of donor concentration provides the corresponding opportunity to form an epitaxial layer of p-type gallium nitride suitable for producing p-n junctions and junction diodes. In addition to the steps recited earlier, including the use of MBE and ECR at the appropriate temperature, the method of producing a p-type epitaxial layer comprises the additional concurrent step of directing an acceptor species onto the growth surface of the silicon carbide single crystal while directing the nitrogen atoms and while directing the gallium atoms and while maintaining the surface at the functional temperature described earlier.

As in the case of other dopant processes, however, merely incorporating dopant atoms into the epitaxial layer is insufficient to produce a layer with satisfactory p-type characteristics. In this regard, and as known by those familiar with the doping of semiconductors, dopants that are added to a semiconductor crystal must be "activated" in some fashion before the electronic properties of the crystal will reflect the presence of these dopant atoms. Activation can take many forms. For example, in doping silicon, dopant atoms are often added by a process called ion implantation following which a doped crystal is thermally annealed to produce activation. Activation is best understood as the process of moving dopant atoms into appropriate lattice positions where they will have the intended electronic effect.

In the present invention, activation has been accomplished by irradiating the surface of the epitaxial layer with an electron beam that activates the acceptor atoms and results in an epitaxial layer of gallium nitride with appropriate p-type characteristics. The irradiation is performed with sufficient energy to activate the acceptor ions that are incorporated into the growing epitaxial layer, but less than the amount of energy that would cause atomic displacement in the growing epitaxial layer.

In another embodiment of the present invention, it is expected that irradiating the surface of the growing epitaxial layer with an electron beam during the growth process will similarly activate the acceptor atoms and result in an epitaxial layer of gallium nitride with appropriate p-type characteristics, and may improve upon the results observed from post-growth activation. As in the case of a post-growth activation, the in-situ irradiation is performed with sufficient energy to activate the acceptor ions that are incorporated into the growing epitaxial layer, but less than the amount of energy that would cause atomic displacement in the growing epitaxial layer.

The preferred process is referred to as low energy electron beam irradiation (LEEBI) and as stated earlier, is carried out at an accelerating voltage which is below that at which atomic displacement would take place. In preferred embodiments of the invention, the LEEBI takes place at an accelerating voltage of between about 3 and 30 kilovolts (kV) with between about 7 and 10 kV preferred. Furthermore, in addition to the focused types of scanning LEEBI treatments that are used for other purposes, the beam may be defocused so that the entire sample is irradiated at once. To date, the inventors are unaware of any other workers who have used an in-situ LEEBI technique combined with an in-situ incorporation of a dopant in an MBE system for growing gallium nitride that also incorporates plasma excitation of the nitrogen source. Additionally, the inventors are unaware of any such technique using a silicon carbide substrate and in the absence of an intermediate layer of aluminum nitride (AlN).

Figure 3:
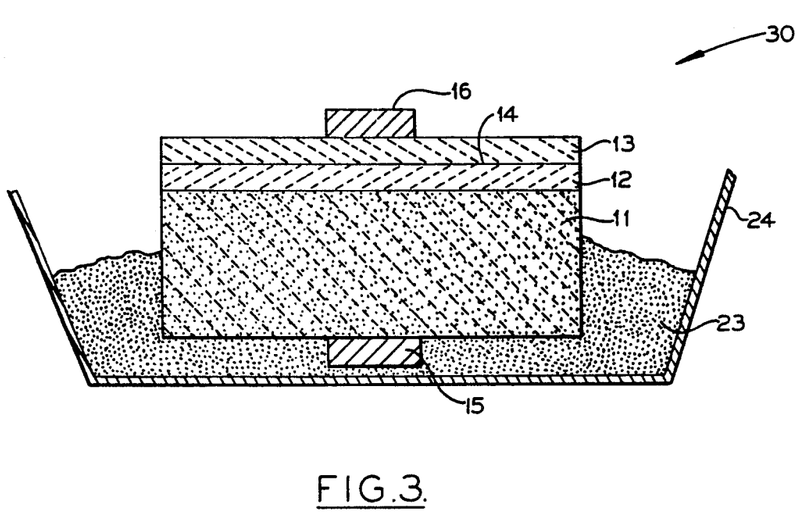
FIG. 3 is a cross sectional schematic view of another packaged LED according to the present invention.
Figure 4:
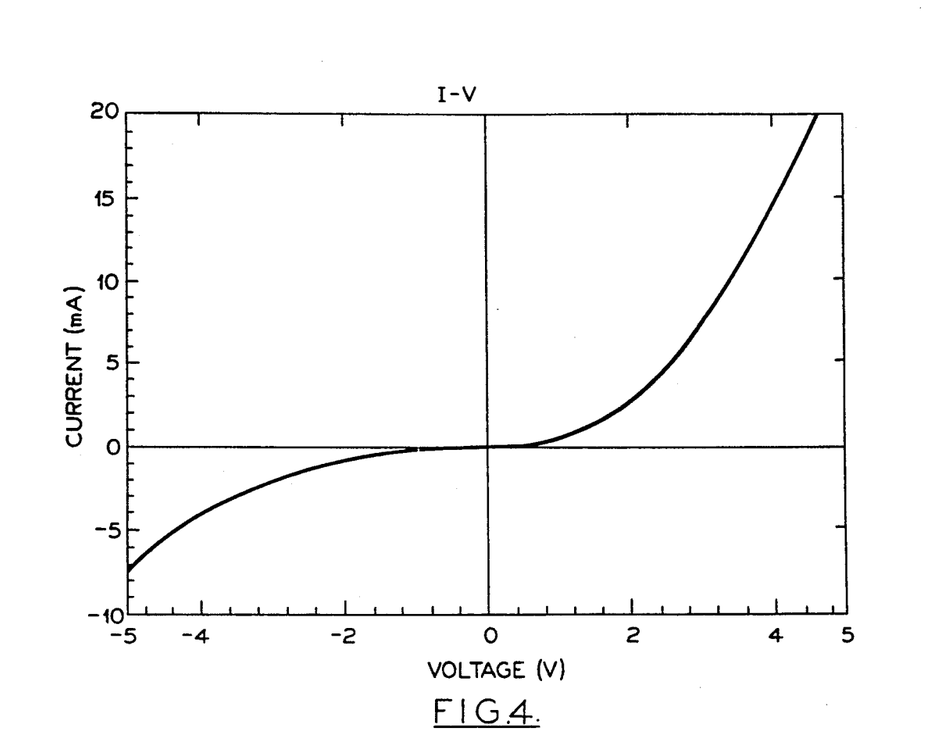
FIG. 4 is a current versus voltage plot of a Schottky diode using a sample of intrinsic n-type gallium nitride formed according to the present invention.
Figure 5:
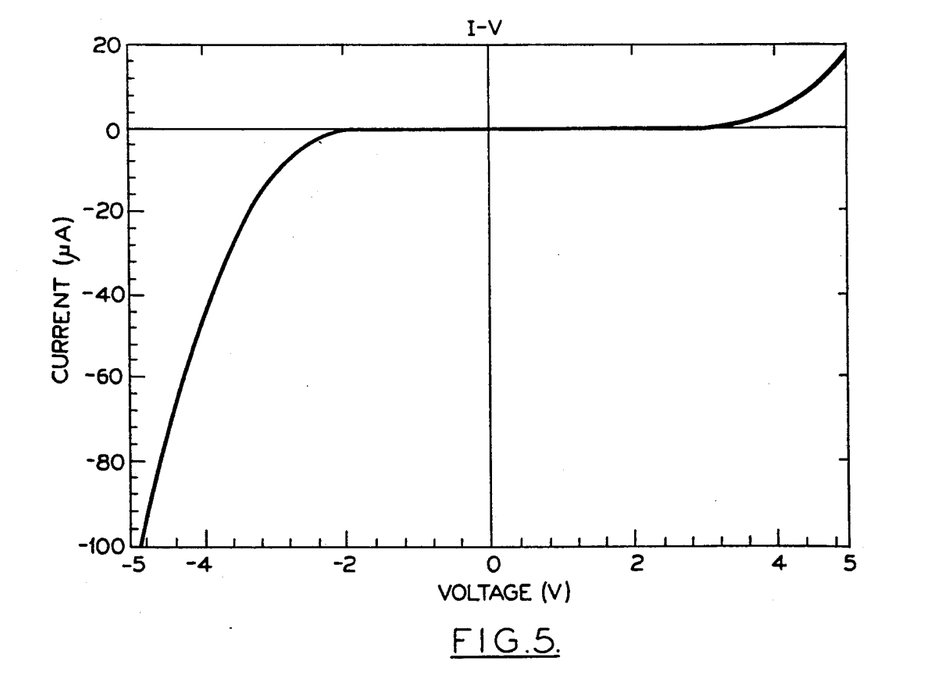
FIG. 5 is a current versus voltage plot of a Schottky diode using a sample of p-type gallium nitride formed according to the present invention.

The success of this process and the desireable intrinsic and p-type character respectively of the resulting material have been confirmed by current-voltage (I-V) measurements using appropriate Schottky contacts. FIGS. 3 and 4 are the I-V plots of this material and demonstrate this success. FIG. 4 demonstrates the n-type material as shown by the large current flow at positive voltage. FIG. 5 demonstrates p-type material as evidenced by the large current flow at negative voltages (e.g. 100 microamps of current at −4.8 volts).

The type of silicon carbide crystal appropriate for use as the substrate is a bulk single crystal of silicon carbide having a single polytype. Because of the relationship between the crystal lattice structures of silicon carbide and gallium nitride, growth on (0001) alpha silicon carbide (6H polytype) results in the growth of corresponding hexagonal (2H) gallium nitride, while growth on the (100) surface of cubic (3C) silicon carbide results in cubic (100) gallium nitride.

In the preferred embodiment appropriate acceptor dopants for gallium nitride include all of the Group II elements, with magnesium preferred. Although intrinsic gallium nitride already tends to have n-type character, if additional donors are included, they can be selected from the Group VI elements, although the transition metal members of Group VI are less preferable.

In a corresponding fashion, once intrinsic undoped epitaxial layers and p-type epitaxial layers of gallium nitride can be produced, appropriate p-n junctions can likewise be produced. In a preferred embodiment of the invention, the method of producing these comprises carrying out a number of the steps described earlier: directing nitrogen atoms onto the growth surface of a single crystal of silicon carbide that provides an acceptable lattice match for gallium nitride, and while directing gallium atoms onto the same silicon carbide growth surface. Concurrently, the surface temperature is maintained high enough to provide sufficient surface mobility for the gallium atoms and the nitrogen atoms to form a single crystal epitaxial layer of gallium nitride on the silicon carbide but lower than the temperature at which the partial pressure of nitrogen species approaches the equilibrium vapor pressure of those nitrogen species over gallium nitride under the ambient conditions. In a typical preferred embodiment, the silicon carbide substrate will be n-type, so that the first epitaxial layer grown thereon will also be selected as n-type.

In forming the p-n junction, therefore, when a sufficient layer of n-type material has been produced, and while the steps of directing nitrogen atoms and gallium atoms onto the growth surface continue, an acceptor species is directed onto the growth surface at a rate relative to gallium and nitrogen that is sufficient to produce a desired p-type epitaxial layer of gallium nitride containing the acceptor atoms upon the n-type epitaxial layer. The growth surface is concurrently maintained at the desired temperature for the time sufficient to produce the p-type epitaxial layer of gallium nitride upon the n-type epitaxial layer to thereby form a p-n junction therebetween. As stated earlier, the p-type layer is activated either during growth or thereafter with a low energy electron beam.

In one of the preferred embodiments of the invention, the step of directing an acceptor species to the growing epitaxial layer at a rate relative to gallium and nitrogen that is sufficient to produce a p-type epitaxial layer of gallium nitride upon the growth surface comprises directing the acceptor at a rate sufficient for the acceptor concentration to exceed the donor concentration of the n-type epitaxial layer previously formed. As known to those familiar with LED's and their operation, it is often desirable to have the carrier concentration of one side of the p-n junction greater than the carrier concentration on the other side so that when a potential is applied, current tends to flow predominantly from the more highly populated side of the junction to the less highly populated side. Thus, if the p-type layer is more highly populated, hole current will dominate the injection process, while if the population of the n-type layer is greater than that of the p-type layer, electron current will dominate the injection process.

In gallium nitride, injection into the p-type layer tends to give the characteristic blue emission at about 440 nm, while injection into the n-type layer will produce the characteristic violet emission at about 370 nm. It will therefore be understood that the invention can be used to produce the desired populations in the desired respective epitaxial layers to in turn produce diodes with preferred characteristic emissions.

As a result of these techniques, the method of the invention can be used to produce an epitaxial layer of intrinsic gallium nitride having a donor concentration of $7 \times 10^{17}$ cm$^{-3}$ or less, and to do so on a silicon carbide single crystal substrate that provides an acceptable lattice match for gallium nitride. In turn, a p-n junction can be formed by an epitaxial layer of intrinsic n-type gallium nitride with such a donor concentration and an adjacent epitaxial layer of p-type gallium nitride having an acceptor concentration greater than $7 \times 10^{17}$ cm$^{-3}$, on the same bulk single crystal substrate of silicon carbide.

Figure 1:
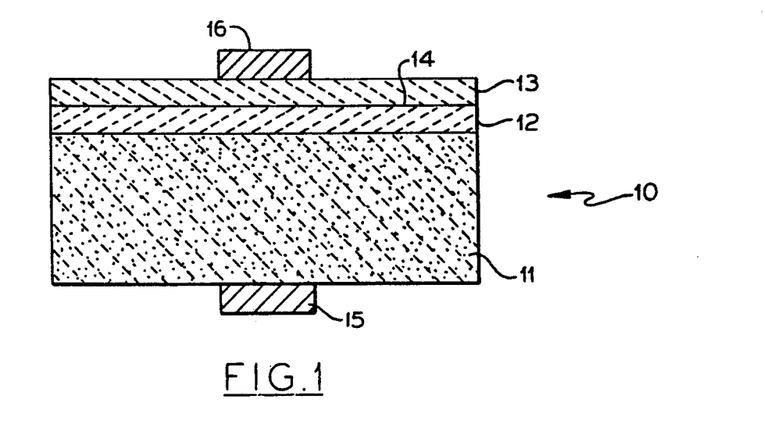
FIG. 1 is a cross sectional schematic view of a light emitting diode formed according to the present invention.
Figure 2:
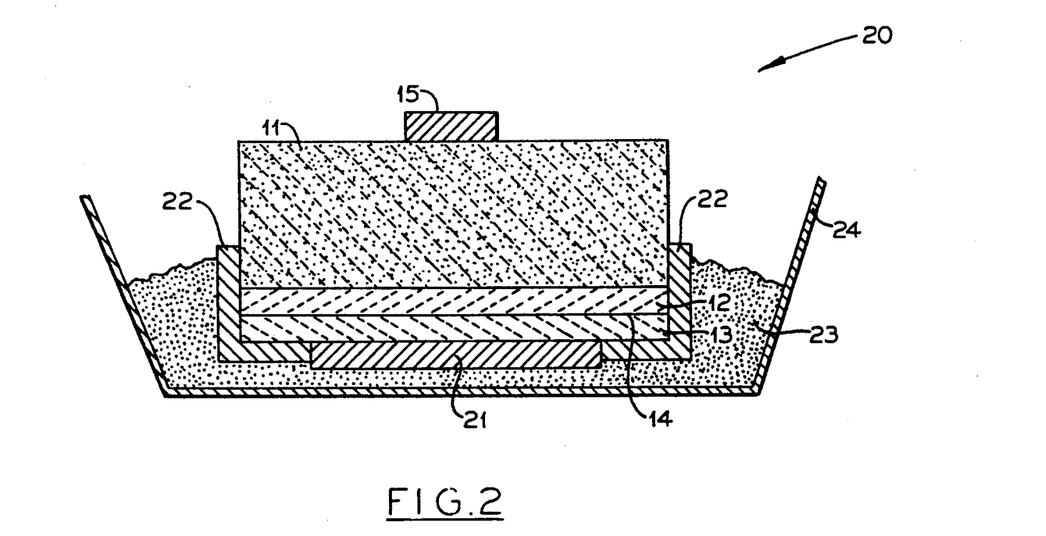
FIG. 2 is a cross sectional schematic view of a packaged LED according to the present invention.

Finally, as illustrated in FIGS. 1, 2 and 3, the method of the invention can be used to produce a high efficiency bipolar light emitting diode from gallium nitride. The LED is shown as the individual die broadly designated at 10 and schematically illustrated as the package broadly designated at 20. The die 10 includes a bulk single crystal 11 of silicon carbide having a single polytype. A first epitaxial layer 12 of intrinsic n-type gallium nitride having a donor concentration of $7 \times 10^{17}$ cm$^{-3}$ or less is upon the substrate 11 and an epitaxial layer 13 of p-type gallium nitride having an acceptor concentration greater than $7 \times 10^{17}$ cm$^{-3}$ is adjacent the n-type epitaxial layer and forms a p-n junction 14 with the n-type epitaxial layer 12. An ohmic contact 15 to the substrate and an ohmic contact 16 to the p-type epitaxial layer 13 complete the structure.

As stated earlier, an LED with the carrier concentrations set forth with respect to FIG. 2 will result in injection into the n-type layer and will correspondingly result in a violet emission. By making the carrier concentration in the n-type layer greater than that of the p-type layer, the predominant injection will be into the p-type layer and an LED with the characteristic blue emission can likewise be produced.

FIG. 2 illustrates a diode package formed from a similar die. For the sake of convenience and clarity, several of the portions are numbered identically as in FIG. 1. These include the substrate 11, the ohmic contact to the substrate 15, the epitaxial layer 12, the epitaxial layer 13, and the junction 14. The package 20 also includes as well a deposited insulator portion 22 which can be formed of silicon dioxide, silicon nitride or some other appropriate insulating compound. A silver based epoxy 23 provides electrical contact to a metal reflector cup 24 through which the current can be applied.

FIG. 2 illustrates some of the advantages of using a silicon carbide substrate. In particular, because the substrate 11 is transparent to both blue and ultraviolet light, the ohmic contact 15 to the substrate can be of minimal size to likewise increase the efficiency of the packaged LED. If a non-transparent substrate were used, the structure shown in FIG. 2 would be unacceptable as the packaged structure would block light emitted from the junction in one direction and the substrate would block it in the other direction. As mentioned earlier, because p-n junctions of gallium nitride have not yet heretofore been successfully been produced on silicon carbide, this convenient and efficient structure has remained unavailable for use with gallium nitride.

FIG. 3 illustrates an alternative embodiment of an LED package broadly designated at 30 in which the substrate 11 is positioned in the conductive epoxy 23 so that the epitaxial layers 12 and 13 are opposite the reflective cup 24. Depending on the particular circumstances or requirements, one or the other of the respective LED packages 20 or 30 may be most appropriately used.

In the drawings and specification, there have been disclosed typical preferred of the invention and, although specific terms have been employed, they have been used in a generic and descriptive sense only and not for purposes of limitation, the scope of invention being set forth in the following claims.

That which is claimed is:

1. A method of forming an epitaxial layer of p-type gallium nitride suitable for producing p-n junctions and junction diodes, the method comprising:
   directing a molecular beam of nitrogen from an electron cyclotron resonance plasma containing nitrogen atoms onto the growth surface of a single crystal of silicon carbide that provides an acceptable lattice match for gallium nitride; while
   directing a molecular beam of gallium in the substantial absence of any other compounds onto the same silicon carbide growth surface; while
   maintaining the surface at a temperature of less than about 650° C. but that is otherwise high enough to provide sufficient surface mobility for gallium atoms and nitrogen atoms to form a single crystal epitaxial layer of gallium nitride on the silicon carbide; while
   directing an acceptor species onto the surface until a desired epitaxial layer is formed; and
   irradiating the epitaxial layer with an electron beam at an energy that is sufficient to activate the acceptor ions in the epitaxial layer, but that is less than the energy that would cause atomic displacement in the epitaxial layer thereby producing the epitaxial layer of p-type gallium nitride.

2. A method according to claim 1 wherein the step of introducing nitrogen atoms from a nitrogen-containing electron cyclotron resonance plasma comprises introducing nitrogen atoms that have been accelerated in the plasma at less than 100 electron volts.

3. A method according to claim 1 wherein the step of introducing nitrogen comprises introducing ammonia from an ammonia-containing electron cyclotron resonance plasma.

4. A method according to claim 1 wherein the step of directing nitrogen onto the growth surface comprises introducing ammonia from an ammonia-containing electron cyclotron resonance plasma.

5. A method according to claim 1 wherein the step of maintaining the surface at a temperature comprises maintaining the temperature at between about 600° and 650° C.

6. A method according to claim 1 wherein the step of directing an acceptor species onto the surface comprises directing a molecular beam of acceptor atoms in the substantial absence of other compounds.

7. A method according to claim 6 wherein the step of directing an acceptor species comprises directing magnesium atoms.

8. A method according to claim 1 wherein the step of directing an acceptor species onto the growth surface at a rate sufficient to produce a p-type epitaxial layer of gallium nitride upon the grown surface of silicon carbide comprises directing the acceptor species onto the surface at a rate sufficient for a the acceptor concentration to exceed the donor concentration of the n-type epitaxial layer formed during the preceding steps.

9. A method according to claim 1 wherein the step of directing nitrogen onto the growth surface of a single crystal of silicon carbide comprises directing the nitrogen onto the (0001) face of 6H silicon carbide.

10. A method according to claim 1 wherein the step of directing nitrogen onto the growth surface of a single crystal of silicon carbide comprises directing the nitrogen onto the (100) face of 3C silicon carbide.

11. A method according to claim 1 wherein the step of directing nitrogen onto the growth surface of a single crystal of silicon carbide comprises directing the nitrogen onto the (111) face of 3C silicon carbide.

12. A method according to claim 1 wherein the step of irradiating the surface follows the step of directing the acceptor species onto the surface.

13. A method according to claim 1 wherein the step of irradiating the surface is concurrent with the step of directing the acceptor species onto the surface.

14. A method according to claim 1 and further comprising the steps of:
    directing a molecular beam of highly reactive, high flux, low uniform energy nitrogen atoms from an electron cyclotron resonance plasma containing nitrogen atoms onto the p-type epitaxial layer following the step of irradiating the surface; while
    directing a molecular beam of gallium atoms in the substantial absence of any other compounds onto the p-type epitaxial layer; while
    maintaining the p-type epitaxial layer at a temperature of less than about 650° C. but that is otherwise high enough to provide sufficient surface mobility for the gallium atoms and the nitrogen atoms to form a single crystal epitaxial layer of n-type gallium nitride on the p-type epitaxial layer and a p-n junction between the layers.

15. A method according to claim 1 and further comprising the steps of:
    directing a molecular beam of highly reactive, high flux, low uniform energy nitrogen atoms from an electron cyclotron resonance plasma containing nitrogen atoms onto the growth surface of a single crystal of silicon carbide that provides an acceptable lattice match for gallium nitride; while
    directing a molecular beam of gallium atoms in the substantial absence of any other compounds onto the same silicon carbide growth surface; while
    maintaining the surface at a temperature of less than about 650° C. but that is otherwise high enough to provide sufficient surface mobility for the gallium atoms and the nitrogen atoms to form a single crystal epitaxial layer of gallium nitride on the silicon carbide;
    all prior to the steps of forming the p-type epitaxial layer.

* * * * *

UNITED STATES PATENT AND TRADEMARK OFFICE
CERTIFICATE OF CORRECTION

Page 1 of 2

PATENT NO. : 5,210,051
DATED : May 11, 1993
INVENTOR(S) : Carter, Jr.

It is certified that error appears in the above-identified patent and that said Letters Patent is hereby corrected as shown below:

On the title page, Item [56]:

UNDER "REFERENCES CITED":

Column 2, "Zensutsu" should be -- Zembutsu --

Column 2, "May 6, 1989" should be -- May/June 1989 --

Column 2, "Galluim" should be -- Gallium --

Column 2, line 33, "an" should be -- a --

Column 2, line 58, "he" should be -- the --

Column 3, line 7, "on" (first occurrence) should be -- one --

Column 4, line 17, "*Electro Chem*" should be -- *Electrochem* --

Column 4, line 18, "1981" should be -- 1971 --

Column 5, line 36, "desireable" should be -- desirable --

Column 6, line 34, "2.4" should be -- 2.4% --

Column 8, line 25, "cells" should be -- cell --

Column 9, line 48, "materials" should be -- material --

Column 11, line 45, "inventors are" should be -- inventor is --

Column 11, line 50, "inventors are" should be -- inventor is --

UNITED STATES PATENT AND TRADEMARK OFFICE
CERTIFICATE OF CORRECTION

PATENT NO. : 5,210,051
DATED : May 11, 1993
INVENTOR(S) : Carter, Jr.

It is certified that error appears in the above-identified patent and that said Letters Patent is hereby corrected as shown below:

Column 11, line 54, "desireable" should be -- desirable --

Column 13, line 35, "an" should be -- a --

Column 13, line 41, "an" should be -- a --

Column 13, line 66, omit "been" (first occurrence)

Column 14, line 1, "an" should be -- a --

Column 14, line 10, after "preferred" insert -- embodiments --

IN THE CLAIMS:

Column 14, line 68, "grown" should be -- growth --

Column 15, line 2, omit "a" (second occurrence)

Signed and Sealed this

Eighteenth Day of January, 1994

Attest:

BRUCE LEHMAN

Attesting Officer   Commissioner of Patents and Trademarks